United States Patent [19]

Harder et al.

[11] Patent Number: 4,805,179
[45] Date of Patent: Feb. 14, 1989

[54] TRANSVERSE JUNCTION STRIPE LASER

[75] Inventors: Christoph S. Harder, Zurich; Heinz Jaeckel, Kilchberg; Heinz P. Meier, Thalwil, all of Switzerland

[73] Assignee: International Business Machines Corporation, Armonk, N.Y.

[21] Appl. No.: 99,936

[22] Filed: Sep. 23, 1987

[30] Foreign Application Priority Data

Sep. 23, 1986 [EP] European Pat. Off. ........ 86113081.3

[51] Int. Cl.[4] ................................................ H01S 3/19
[52] U.S. Cl. ........................................ 372/47; 372/45; 372/46; 372/50; 372/97
[58] Field of Search ................. 372/47, 48, 43–46, 372/50, 97; 357/17

[56] References Cited

U.S. PATENT DOCUMENTS 4,334,311 6/1982 Oomura et al. ...................... 372/47
4,592,061 5/1986 Kumabe et al. ...................... 372/47

FOREIGN PATENT DOCUMENTS 0127092 10/1980 Japan ................................. 372/47
0198685 12/1982 Japan ................................. 372/47
0065818 12/1982 Japan .
0103415 3/1984 Japan .
0167084 9/1984 Japan .
0067586 12/1988 Japan .

OTHER PUBLICATIONS

Applied Physics Letters, vol. 47, No. 12, Dec. 1985, pp. 1309-1311, American Institute of Physics, Woodbury, NY, US D. L. Miller: "Lateral P-N Junction Formation in GaAs Molecular Beam Epitaxy by Crystal Plane Dependent Doping".

Primary Examiner—William L. Sikes
Assistant Examiner—Georgia Y. Epps
Attorney, Agent, or Firm—Jackson E. Stanland

[57] ABSTRACT

A GaAs/AlGaAs-transverse junction stripe (TJS) laser with p-n junction formation by crystal plane dependent doping is described. The laser structure includes a molecular beam epitaxy (MBE)-deposited hetero-structure comprising AlGaAs layers with an active GaAs layer sandwiched therebetween. These layers are grown on the patterned surface of a GaAs substrate which provides (100)-plane oriented planar ridges and grooves, the edges being (111A)-plane oriented. p-n homojunctions are formed in the GaAs layer at the intersections of the (111A) and (100) crystal planes. Ohmic contacts are provided for applying currents of at least the threshold level of the junctions. These TJS lasers can be used to form 1- or 2-dimensional arrays of phase-coupled lasers for providing high optical power output.

29 Claims, 3 Drawing Sheets

TRANSVERSE JUNCTION STRIPE LASER

BACKGROUND OF THE INVENTION

1. Field of the Invention

The invention relates to a transverse junction stripe laser (TJS) consisting of a semiconductor heterostructure comprising high bandgap cladding layers with an active low bandgap layer sandwiched in between, these layers being deposited on a surface of a semiconductor substrate. These lasers can be used in 1- or 2-dimensional arrays for providing high optical power output. The structure is particularly suited for GaAs technology devices.

2. Description of the Related Art

Optical light wave communications have become increasingly important in recent years for both telecommunications and data transfer within data processing systems. Light beams are generated, modulated to provide optical signals representative of data to be communicated, transmitted and detected before they are applied to electronic circuitry for processing. One of the important elements in these optical systems is a source for the light beam. Here, lasers of quite different structures, materials and concepts have been utilized with great success.

Increasingly important are p-n junction semiconductor lasers because of their compact size and because their technology is compatible with that of the associated electronic circuitry. In these devices, laser action is initiated by simply passing a forward current through the p-n junction, which itself represents a diode. As the threshold current is reached, stimulated emission occurs and a monochromatic and highly directional beam of light is emitted from the junction. These lasers can be modulated easily by modulating the current. Since photon lifetimes in these lasers are very short, modulation at high frequencies can be achieved. However, in homojunction lasers, comprising e.g. a GaAs p-n junction, the threshold current density has been found to be exceedingly large and to increase rapidly with increasing temperature. This imposes serious difficulties in operating the laser continuously at room temperature.

In order to reduce the threshold current density, multi-layer hetero-structures have been suggested and both single hetero-structures (e.g., n-GaAs/p-GaAs/p-AlGaAs) and double hetero-structures (e.g., n-AlGaAs/p-GaAs/p-AlGaAs) have been designed. These are fabricated by growing, on high-quality semiconductor substrates, successive epitaxial layers with different alloy compositions and dopings. Molecular beam expitaxy (MBE) processes have been used. Such hetero-structure lasers require only low threshold current densities because of (1) the carrier confinement provided by the energy barriers of higher bandgap material surrounding the active region, and (2) the optical confinement provided by the abrupt reduction of the refractive index outside the active region.

Most hetero-structure lasers are made in stripe geometries where the lasing area is confined to a narrow region under a stripe contact. The advantages of the stripe geometry include (1) a reduction of the cross-sectional area which, in turn, reduces the required operating current, and (2) an improved response time owing to small junction capacitances.

In these epitaxially grown hetero-structure lasers, the p-n junctions are normally formed at the horizontal boundaries between the active n-conductivity layer and a neighboring p-type layer, with the current flowing perpendicular thereto. However, more recently, so-called transverse junction strip (TJS) geometry lasers have been described which also consist of an epitaxially grown sequence of differently composed and/or doped semiconductor layers but with lateral carrier injection into and through the active layer in which a vertical p-n homojunction is provided. The main advantage provided by these TJS lasers over conventional vertical carrier-injection methods is that carrier and optical confinement are obtained not only in the vertical direction (through the AlGaAs-GaAs interface) but also in the lateral direction (through the P+ -p-n+ interface). This, in turn, leads to still lower threshold currents and further reduced capacitances.

In hitherto known TJS geometry lasers, the p-n junction in the active layer is formed by a Zn-diffusion which converts part of the layered n-type structure into p-type. The injection is then from the n-GaAs active layer to the Zn-diffused p-GaAs. Such TJS laser structures have, e.g., been described in an article "New Structures of GaAlAs Lateral-Injection Laser for Low-Threshold and Single-Mode Operation" by W. Susaki et al (IEEE Journal of Quantum Electronics, Vol. QE-13, No. 8, August, 1977, p. 587–591) and in a further article entitled "Transverse-Junction-Stripe-Geometry Double-Heterostructure Lasers with Very Low Threshold Current" by H. Namizaki et al (Journal of Applied Physics, Vol. 45, No. 6, June, 1974, p. 2785/86).

These TJS laser structures have been used successfully for low-threshold laser diodes with good aging properties. However, the fabrication process for the formation of the transverse p-n junction in the active layer is very complicated and difficult to control. In addition, since it uses a transverse p-n homojunction, no stable mode-guiding is provided in the transverse direction. Therefore, a complicated diffusion process with a stepped doping profile is required to build-in a small difference in the optical indices of refraction between the p- and n-regions. Since the index of refraction is not only material dependent but depends also on the injected carrier densities at the p-n interface, the laser diode can switch to oscillation in higher order transverse mode configurations at increased drive current. This causes severe non-linearities in the light-current characteristic and considerably increased optical noise levels.

These drawbacks are avoided by the laser structure of the present invention which is based on the observation that GaAs, doped with an amphoteric dopant such as silicon (Si), grown by MBE, exhibits a conductivity which depends on the crystallographic orientation of the GaAs substrate. For example, Si doping of a GaAs epitaxial film on a (111A)-surface can result in p-conduction and on a (100)-surface in n-conduction. This means that GaAs, grown on differently oriented GaAs crystal planes, can lead to the simultaneous deposition of p- and n-conduction material and to the formation of p-n junctions at the intersection of the regions of different doping.

This "crystal plane dependent doping" effect has been reported in an article "Lateral p-n Junction Formation in GaAs Molecular Beam Epitaxy by Crystal Plane Dependent Doping" by D. L. Miller (Applied Physics Letters, Vol. 47, No. 12, December, 1985, pp. 1309–1311) and in another article "Crystal Orientation Dependence of Silicon Doping in Molecular Beam Epitaxial AlGaAs/GaAs Heterostructures" by W.I. Wang et al (Applied Physics Letters, Vol. 47, No. 8, October, 1985, p. 826–828).

These references are representative of the present state of the art. They describe the effect of the crystal orientation on the doping but do not disclose or suggest the concept or structures of the present invention.

Also proposed herein is an application of the laser of the present invention in 1- and 2-dimensional arrays of phase-coupled lasers. Such arrays are capable of providing high power light radiation as needed for, e.g., optical recording techniques. The required power levels can, at present, not be provided by single diode lasers without the risk of potential mirror damage or lifetime degradation.

In order to obtain higher output power, linear 1-dimensional laser arrays have been suggested and analyzed, e.g., in an article "Experimental and Analytic Studies of Coupled Multiple Stripe Diode Lasers" by D. R. Scifres et al (IEEE Journal of Quantum Electronics, Vol. QE-15, No. 9, September 1979, pp. 917–922). Subjects of this study were coupled multiple stripe phase-locked, room-temperature lasers that provide well-collimated higher power beams.

In contrast to the known structures, the laser array proposed in the following can be extended to a 2-dimensional structure providing for a further increase in beam power.

It is a main object of the present invention to provide a semiconductor laser with high mode-stability for continuous operation at room temperature.

Another object is to provide a GaAs/AlGaAs transverse junction stripe (TJS) hetero-structure laser that can be produced using established, noncritical fabrication processes.

A further object of the invention is to provide a laser array capable of producing a highly collimated high-power beam.

SUMMARY OF THE INVENTION

The invention as claimed is intended to meet these objectives and to remedy the drawbacks and deficiencies of known laser devices. It solves the problems hitherto encountered in the design of easy-to-fabricate, continuous room temperature operation laser structures by providing a TJS structure using the method of p-n junction formation by crystal plane dependent doping. The problems in providing high power, coherent and collimated beams are solved with a 2-dimensional array of these lasers in which the required phase relationship between neighboring lasers can be reliably controlled.

The advantages offered by the invention are mainly that the TJS laser structure can be fabricated avoiding the difficul process of deep diffusion and by replacing that process with crystal plane dependent doping which permits the simultaneous growth of p- and n-regions in the active lasing layer. Further, the new laser structure provides for stable dielectric mode guiding along the active lasing layer resulting in improved mode stability. The proposed TJS laser, because of its compact structure and the fabrication method used, also permits the building of a high-power output 2-dimensional laser array.

These and other objects, features, and advantages will be apparent from the following more particular description of the preferred embodiments.

BRIEF DESCRIPTION OF THE DRAWING

The invention is described in detail below with reference to drawings which illustrate specific embodiments of the invention and in which.

DESCRIPTION OF THE PREFERRED EMBODIMENT

Figure 1:
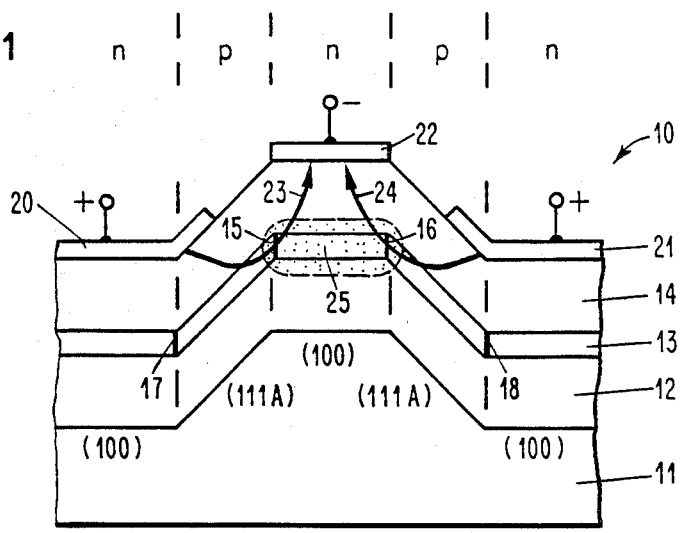
FIG. 1 is a schematic illustration of the basic elements of a first embodiment of the inventive laser structure.

Referring now to the drawings in more detail, and first to FIG. 1 thereof, there is shown a schematic cross-sectional illustration of the basic structure of an embodiment of the inventive laser. This figure will also be used to explain the current flow within the laser structure as determined by the voltages applied to the anode and cathode electrodes and the p-n junctions formed within the active layer of the device.

The laser 10 comprises a semiconductor substrate 11 consisting of semi-insulating gallium arsenide (SIGaAs).

On this substrate, a hetero-structure of subsequently deposited layers 12, 13, and 14 is grown to provide the active "lasing" layer 13 and optical cladding layers 12 and 14 between which layer 13 is sandwiched. The cladding layers consist of higher band gap material than the active layer. In the example, GaAs is chosen for the active layer 13 whereas layers 12 and 14 are made of AlGaAs. These three layers are grown in a MBE process with an amphoteric dopant, such as Si. Arranged on top of the upper cladding layer 14 are a cathode 22 and, at each side thereof, anodes 20 and 21. These electrodes are, as indicated, connected to appropriate negative or positive voltage sources.

The surface of the substrate 11 is patterned to exhibit a protruding ridge having a horizontal surface and sloped edges that lead to lower horizontal planes of neighboring recesses or grooves. The horizontal surface sections are of a first crystallographic orientation, in the example (100), whereas the edges exhibit a different, higher crystallographic index orientation, in the example (111A). Due to the above mentioned effect that the conductivity of epitaxially grown GaAs, if doped with an amphoteric dopant, depends on the crystallographic orientation of the underlying GaAs substrate, the sections of layers 12, 13 and 14 above the horizontal surfaces are n-type, forming n-columns, whereas the sections of these layers above the sloped edges are p-type, forming p-columns. This results in the formation of p-n junctions 15 through 18 at the intersections of the n-type and the p-type sections within active layer 13. Using known cleaving or etching processes, the laser structure is completed by providing mirrors at both ends of the laser structure, i.e., in planes parallel to that of the drawing that determine the length of the device and thus the length of the laser waveguide.

In operation, positive and negative voltage sources are connected to anodes 20, 21 and cathode 22, respectively, to forward-bias junctions 15 and 16. This results in a current flow from the anodes 20, 21 through the respective junctions 15, 16 to cathode 22 as indicated by the two arrows 23 and 24. As soon as currents 23 and 24 reach the laser threshold current level, the section of the active layer between the junctions 15 and 16 and its immediate vicinity starts "lasing", i.e., it emits radiation of a wavelength characteristic for GaAs which is in the order of $0.8\mu$. This light emitting region is indicated by the stipled area 25. It should be noted that current flow through the parasitic AlGaAs p-n junctions at the p-n intersections of the cladding layers 12 and 14 is low because the turn-on voltage of these diodes is higher than that of the active GaAs p-n junctions.

From the above it is apparent that the anode electrodes 20, 21 need to be electrically connected to the p-columns formed above the (111A)-plane sloped edges of the substrate 11. This can be achieved either by forming the anodes on the p-sections of the upper cladding layer 14 (the anodes may extend over the lower horizontal n-section as in the structure of FIG. 1), or by converting part of the outer n-columns to $p^+$-type using a Zn-diffusion process with subsequent anode deposition on top of these $p^+$-sections. The latter alternative is chosen in the embodiment that will now be described with the aid of FIG. 2.

Figure 2:
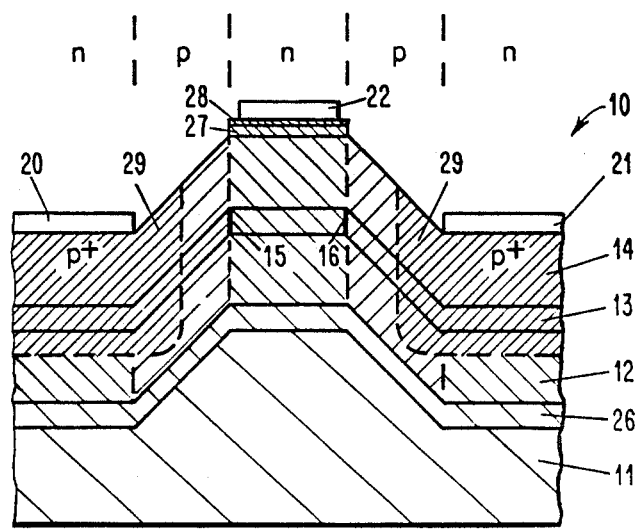
FIG. 2 is a more detailed cross-sectional representation of the embodiment of the inventive laser structure illustrated in FIG. 1.

FIG. 2 shows a more detailed cross-sectional view of an embodiment of the inventive laser that is structured in accordance with the basic inventive principles that have been outlined with the aid of FIG. 1. For corresponding elements the same reference numbers are used in both figures.

The semi-insulating GaAs substrate on which the laser structure is deposited is again designated 11. The horizontal surfaces correspond to the (100) crystal plane, the sloped edges to the (111A) plane. The flat surface of the ridge is about $4\mu$ wide and the groove recess $5\mu$ deep. For the fabrication of such patterned GaAs surfaces any of the methods described in the following articles can be used:

1. "Chemical Etching Characteristics of (001) GaAs" by S. Adachi et al (Journal Electrochem. Soc.: Solid State Science and Technology, Vol. 130, No. 12, December, 1985, p. 2427-2435), 2. "Localized GaAs Etching with Acidic Hydrogen Peroxide Solutions" by D. W. Shaw (Journal Electrochem. Soc.: Solid-State Science and Technology, Vol. 128, No. 4, April 1981, p. 874-880) and 3. "GaAs Radical Etching with a $Cl_2$ Plasma in a Reactive Ion Beam Etching System" by S. Sugata et al (Japanese Journal of Applied Physics, Vol. 23, No. 8, August, 1984, p. L564-L566).

In practice, a complete GaAs wafer will be etched to form a pattern of a large number of groove-ridge-groove sequences. Only after completion of the layer deposition and device characterization processes will the individual laser structures be separated, normally in a cleaving process. For a single laser, only a single ridge with its edges and the neighboring horizontal groove surfaces are needed and only these are shown in FIG. 2.

Before depositing layers 12, 13 and 14, a buffer layer 26 of undoped GaAs of about $2\mu$ thickness is applied to the substrate surface to improve crystal quality. The use of this buffer layer is optional, as it is not an essential element of the proposed laser structure.

Next, the sequence of amphoterically doped layers is grown, in the MBE process, on the patterned surface of the substrate-buffer layer structure to provide lower cladding layer 12, active layer 13 and upper cladding layer 14. Lower cladding layer 12 is $1\mu$ thick and consists of highly doped $Al_{0.5}Ga_{0.5}As$ (amphoteric Si, $2\times10^{17}cm^{-3}$). Next is the active GaAs layer 13. It is $0.1\mu$ thick and doped with amphoteric Si at $2\times10^{17}$ to $2\times10^{18}cm^{-3}$. Deposited on top of this is the upper cladding layer 14, also Si-doped ($2\times10^{17}-1\times10^{18}cm_{-3}$), and consisting of $Al_{0.5}Ga_{0.5}As$ with a thickness of $1\mu$.

Arranged on top of the layered hetero-structure are cathode electrode 22 and two anode electrodes 20, 21 as shown in FIG. 2. Each electrode is a 3-layer structure consisting of Ti—Pt—Au films of 10 nm, 10 nm and 200 nm thickness, respectively.

Between the cathode 22 and the upper cladding layer 14 is a $n^+$-contact layer 27 (30 nm thick) of highly n-doped GaAs and a $n^{++}$-InAs layer (20 nm thick) that is so highly doped that a non-alloyed cathode contact can be made.

The anodes 20, 21 are deposited on the two fine-hatched $p^+$ contact areas 29. These $p^+$-zones are about $1.5\mu$ deep and extend, as indicated, into the lower cladding layer 12. They can be made using a conventional Zn-diffusion process (1 hour at 700° C.).

As stated above, a plurality of such laser structures can be fabricated simultaneously on a single wafer. Device separation is done in a cleaving process which also results in providing reflecting mirror surfaces that terminate the optical waveguide in which laser action takes place. A proper waveguide length is between 200 and $500\mu$.

The laser structure of FIG. 2 represents only an example of a device in which the invention concept is implemented. Alternative structures, still based on the inventive concept, can be designed to serve particular requirements by, e.g., choosing different semiconductor material, changing dimensions and doping concentrations, using different substrate surface crystal orientations, or changing the electrical contact configurations.

For instance, the ridge structure may be widened (from $4\mu$ to $10\mu$ or more) thereby providing for two separate lasing regions in the vicinity of junctions 15 and 16, respectively, rather than a single light emitting region 25 as in the examples of FIGS. 1 and 2. Such a structure, providing for two individual lasers, can be useful in fiber optic transmissions with fiber diameters of about $50\mu$ where the second laser can serve as a redundant stand-by device in case of failure of the initially used first device.

In other alternative designs, anode and cathode electrode arrangements may be changed such that light emission takes place in the "sloped" area defined by junctions 15 and 17 rather than in area 25 defined by junctions 15 and 16.

Also, the active layer 13 may be replaced by a so-called GRIN-SCH quantum well structure. Such structures are, e.g., described in an article "Extremely Low Threshold (AlGa)As Graded-index Waveguide Separate-Confinement Heterostructure Lasers Grown by Molecular Beam Epitaxy" by W. T. Tsang, (Applied Physics Letters, Vol. 40, No. 3, February, 1982, p. 217-219).

The described new laser structure provides for stable mode-guiding in both a direction perpendicular to the layers and in a transverse direction parallel to the layers. The emitted light is confined and guided by the different refractive indices: in the vertical direction these are obtained because the refractive index of the AlGaAs cladding layers is different, i.e., lower than that of the active layer, whereas the break in the active layer at the p-n intersections provides for an increase in the effective optical index of refraction in the lateral direction. This improved waveguiding prevents mode-instabilities that have resulted in severe problems in operating the hitherto known TJS lasers.

The basic structure and concept of the above described laser can advantageously be used to design high power laser arrays, both 1-dimensional as well as 2-dimensional.

Described in the following are arrays of phase-coupled TJS lasers that are capable of providing a highly collimated beam due to the large phase-coherent effective output aperture. In the structures to be described below, the individual lasers can be placed close enough, typically at a distance of 1 to $2\mu$, such that the individual optical modes are phase-locked together. Different lasing modes of the individual p-n junctions have a controlled overlap and are therefore coupled by the non-linear interaction with the gain medium of surrounding individual lasers. Proper phase relationship between neighboring lasers can be controlled either by varying the spatial separation distance or by proper material composition as e.g. the Al-content in the cladding layers.

Figure 3:
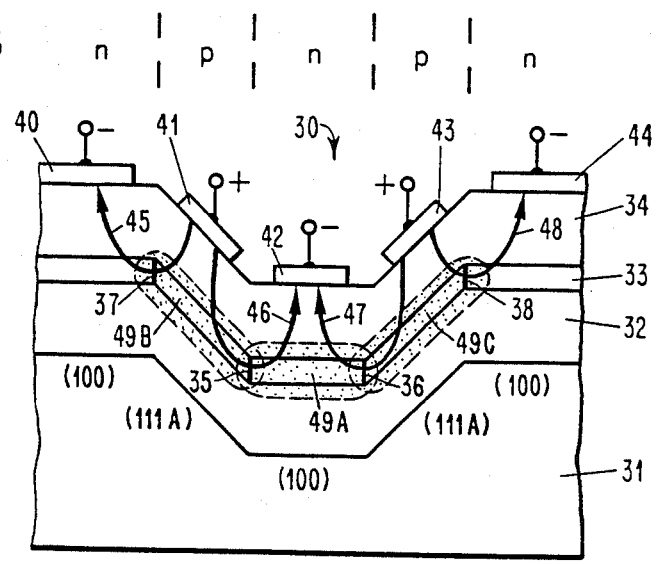
FIG. 3 is a schematic illustration of the basic elements of a 1-dimensional array of lasers structured in accordance with the invention.

FIG. 3 schematically shows a cross-section of a 1-dimensional laser array that is, in principle, very similar to the structure of the single laser above described.

As in the laser structure of FIG. 1, a heterostructure 30, consisting of a pair of AlGaAs cladding layers 32 and 34 with an active GaAs layer 33 between, is deposited on the patterned surface of a GaAs substrate 31. The substrate surface is, like that of the single laser of FIG. 1, patterned to provide sections of (100) and (111A) crystal orientations on which the amphoterically (Si)-doped layers 32, 33 and 34 grow as n- and p-type material, respectively. At the intersections of these n- and p-type sections of the active layer 33, p-n junctions 35, 36, 37 and 38 are formed as indicated in FIG. 3. Anode electrodes 41 and 43 are connected to the p-type edge columns whereas cathode electrodes 40, 42 and 44 are deposited on top of the n-type columns as shown. When applying positive and negative voltages to the anodes and cathodes, respectively, currents indicated by arrows 45, 46, 47 and 48 will flow. Once the currents passing through the p-n junctions exceed the threshold level, light will be emitted from the stipled areas 49A, 49B and 49C, each of which is defined by the associated pairs of p-n junctions, namely 35-37, and 36-38, respectively. The overlapping relationship between these individual lasing sections provides for proper phase-coupling.

Figure 4:
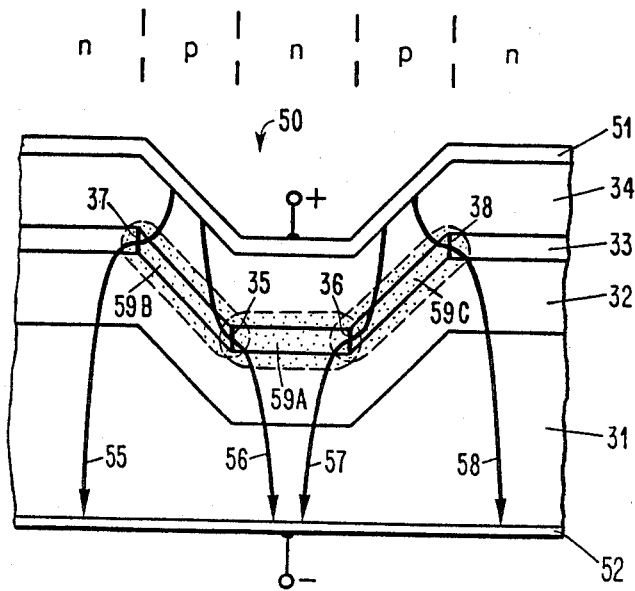
FIG. 4 is a schematic illustration of the basic elements of a further 1-dimensional array of lasers structured in accordance with the invention.

Another embodiment of a 1-dimensional laser array 50 is schematically shown in FIG. 4. The hetero-structure consisting of layers 32, 33 and 34 that is deposited on substrate 31 corresponds to that of the array illustrated in FIG. 3. The array of FIG. 4 differs from that of FIG. 3 in the arrangement of the anode and cathode electrodes and the resulting current flow. A single anode 51 covers the top of the structure and cathode 52 is connected to the substrate 31 as indicated. Applying a voltage between anode and cathode that causes the above-threshold level currents 55, 56, 57, 58 to flow through junctions 37, 35, 36 and 38, respectively, results in the emission of light in stipled areas 59A, 59B and 59C in a manner very similar to the operation of the laser structure of FIG. 3.

Figure 5:
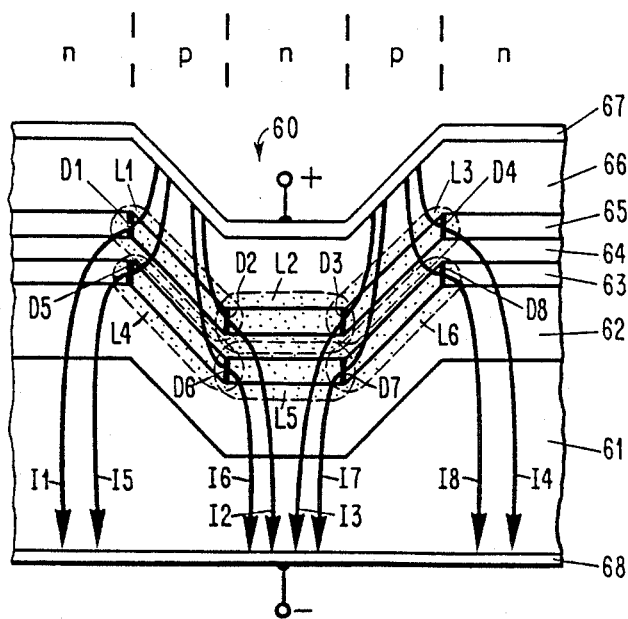
FIG. 5 is a schematic illustration of the basic elements of a 2-dimensional array of lasers structured in accordance with the invention.

The structure above described also forms the basis for the 2-dimensional laser array illustrated in FIG. 5. The hetero-structure 60 is similar to structure 50 in FIG. 4. It is, however, extended by the addition of a second active GaAs layer 65 and an associated cladding layer 66 whereas layers 62, 63 and 64 correspond to layers 32, 33 and 34 of the 1-dimensional array shown in FIG. 4, p-n junctions are formed at the p-n intersections of both active layers, i.e., junctions D1 to D4 in layer 65, and junctions D5 to D8 in layer 63.

Figure 6:
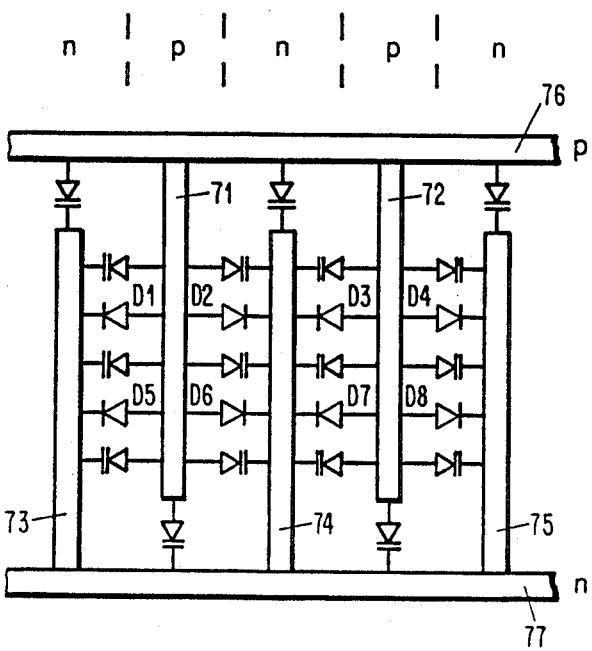
FIG. 6 is a simplified equivalent-circuit diagram for the laser array illustrated in FIG. 5.

In this array, all diode junctions D1 to D8 are parallel connected. The currents I1 to I8, resulting from a forward-bias voltage applied between anode 67 and cathode 68, are fed vertically into the p-columns and fanout through the junctions which connect the p- and n-columns of the structure. This is schematically illustrated in FIG. 6 in which the p-columns (grown on the (111A)-oriented substrate surfaces) are represented by vertical stripes 71 and 72 whereas stripes 73, 74 and 75 represent the n-columns (grown on the (100)-oriented substrate surfaces). Junctions D1 to D8 are shown as normal, solid diode symbols. The thin "double-line" diode symbol represents the p-n junctions in the AlGaAs cladding layers and the parasitic AlGaAs/GaAs heterojunctions at the end-regions of the p- and n-columns. Current through the AlGaAs junctions is low because of the higher turn-on voltage of these junctions compared to the active GaAs junctions. Leakage through the AlGaAs-GaAs hetero-junctions can be kept low by adding nonamphoterically doped p- and n-AlGaAs cladding layers 76 and 77 at the top and the bottom of the layered structure, respectively, i.e., between anode 67 and upper cladding layer 66 and between lower cladding layer 62 and substrate 61.

Referring again to FIG. 5, light will be emitted from stipled areas L1 to L6 as soon as the current flowing through junctions D1 to D8 exceeds the threshold current value. Phase-coupling between the individual lasers is achieved due to the overlapping relationship which exists between the light emitting areas of the same active layer (i.e. between L1-L2 and L1-L3 in layer 65, and between L4-L5 and L5-L6 in layer 63) as well as between adjacent areas that do not belong to the same layer (i.e., between L1-L4, L2-L5, L3-L6). Coupling between sections of the active layers through cladding layer 64 is made possible by making AlGaAs layer 64 only $0.5\mu$ thick, the other cladding layers 62 and 66 having a thickness of $1\mu$ as in the single-laser structure of FIG. 2.

From the above it will be evident that many other modifications, variations and applications of the inventive laser structure that still fall within the scope and spirit of the present invention will be apparent to those skilled in the art.

The structures herein described can be fabricated using technologies that are available and by applying the knowledge and understanding disclosed in the art for which the publications referred to earlier are representative. Particularly, the MBE and also the metalorganic chemical vapor deposition (MOCVD) processes have been developed to a point where the required heterostructures can be produced in a single run, i.e., in the same vacuum, without great difficulties and with sufficient accuracy, reliability and reproducibility. The other elements of the described laser structures can be fabricated using evaporation or epitaxy techniques, masking and etching processes that are well known in the art.

Having thus described our invention, what we claim as new and desire to secure as Letters Patent is:

1. In a semiconductor laser the structure, comprising in combination:
   a substrate including first and second surface sections having different crystallographic orientation,
   a semiconductor laser formed on said substrate and including an active layer extending laterally over said first and second surface sections and having a p-n junction therein extending in a direction substantially transverse to the surface of said active layer, radiation being produced by the presence of an electrical current across said transverse p-n junction of a magnitude above a threhold value for lasing,
   said active layer being amphoterically doped to produce by crystal plane dependent doping a first n-type region therein where said active layer is adjacent said first surface section of said substrate and a second p-type region where said active layer is adjacent said second surface region of said substrate, and
   electrical means for producing an electrical current across said transverse p-n junction of a magnitude greater than said threshold value to produce lasing radiation in said active layer.

2. The laser structure of claim 1, further including cladding layers located on each side of said active layer, each of said cladding layers having a different index of refraction than that of said active layer and serving to confine said lasing radiation.

3. The laser structure of claim 1, where said first and second surface sections of said substrate are non-coplanar.

4. The laser structure of claim 1, where said first surface section of said substrate has (100) orientation and said second surface section has (111A) orientation.

5. The laser of structure of claim 1, where said laser is a transverse stripe laser.

6. The laser structure of claim 1, where said laser is a transverse stripe laser comprising a semiconductor hetero-structure deposited on a semiconductor substrate.

7. The laser structure of claim 6, where said heterostructure includes said active layer and cladding layers of higher bandgap than that of said active layer, said cladding layers being located on each side of said active layer.

8. The laser structure of claim 7, further including an undoped semiconductor buffer layer between said substrate and said hetero-structure laser.

9. The laser structure of claim 6, where said transverse junction stripe laser includes a plurality of stacked hetero-structures.

10. The laser structure of claim 6, where said heterostructure is comprised of epitaxially deposited layers.

11. The laser structure of claim 6, where said active layer is comprised of GaAs.

12. The laser structure of claim 10, where said cladding layers are comprised of AlGaAs.

13. The laser structure of claim 12, where said active layer and said cladding layers have silicon therein as an amphoteric dopant.

14. The laser structure of claim 1, where said first surface section of said substrate exhibits a ridge with a substantially planar top surface and said second surface section is a surface region inclined with respect to said first region, said first and second surface sections of said substrate having different crystallographic orientations.

15. The laser structure of claim 14, where said substrate also includes a further substantially planar surface section adjoining said inclined surface section, said further planar surface section being non-coplanar with said first said planar surface section.

16. The laser structure of claim 1, further including an undoped semiconductor buffer layer located between said substrate and said laser.

17. In a transverse junction stripe laser, the structure comprising:
   a substrate having a first surface section of a first conductivity-type and a second surface section of a second conductivity-type,
   a semiconductor heterostructure laser epitaxially deposited on said substrate, said heterostructure laser including at least one active layer in which radiation is produced during lasing operation and semiconductor cladding layers of a material having a different bandgap than the bandgap of said active layer, said cladding layers being located on each side of said active layer,
   said active layer and said cladding layers including an amphoteric dopant and having first and second conductivity-type regions therein corresponding to said underlying first and second surface sections of said substrate, the intersections of said first and second conductivity-type regions in said active layer forming at least one p-n junction transverse to the surface of said active layer, and
   electrical means for producing an electric current across said at least one p-n junction of a magnitude at least equal to the laser threshold current level for producing lasing radiation in said active layer.

18. The laser of claim 17, where said first and second surface sections of said substrate are non-coplanar.

19. The laser of claim 18, where said first surface section of said substrate is substantially planar and said second surface section of said substrate is inclined with respect to said first substrate surface section.

20. The laser of claim 19, where said active layer is GaAs and said cladding layers are comprised of AlGaAs.

21. The laser of claim 20, where said amphoteric dopant is silicon.

22. The laser of claim 18, further including an undoped semiconductor buffer layer located between said substrate and said heterostructure laser.

23. The laser of claim 17, including a further semiconductor heterostructure laser stacked on said semiconductor heterostructure laser, said further heterostructure laser including a second active layer in which radiation is produced during lasing operation, and semiconductor cladding layers of higher bandgap than said second active layer located on each side of said second active layer.

24. The laser of claim 17, wherein said electrical means produces an electrical current through a plurality of p-n junctions to provide an array of lasing p-n junctions.

25. The laser of claim 24, where said lasing junctions are closely spaced and phase-coupled.

26. The laser of claim 17, including a second active layer located adjacent to said semiconductor heterostructure and having a transverse p-n junction therein across which an electrical current can flow of a magnetic greater than the laser threshold current to provide lasing radiation from said second active layer.

27. The laser of claim 26, where said lasing p-n junctions in said active layers are phase-coupled.

28. A transverse junction stripe laser comprising:
   a semiconductor substrate,
   a semiconductor hetero-structure including an active layer that is sandwiched between cladding layers of a material with a higher bandgap than that of said active layer, wherein
      the surface of said substrate exhibits planar as well as inclined regions, the crystallographic index of said planar regions being different from that of said inclined regions,
      said active and said cladding layers being epitaxially grown, with an amphoteric dopant, on said substrate surface such that the sections of said layers deposited on said planar regions are of a first conductivitytype and the sections deposited on said inclined regions are of a second conductivity-type thus forming at least one p-n junction at the intersections of said first and said second conductivity-type sections of said active layer, and
   electrical means for applying currents of at least a threshold level to said junction to produce radiation in said active layer.

29. An array of phase-coupled transverse stripe junction lasers comprising:
   a semiconductor substrate,
   a semiconductor hetero-structure including at least one active layer sandwiched between cladding layers of a material with a higher bandgap than that of said active layer, wherein
      the surface of said substrate exhibits planar as well as inclined regions, the crystallographic index of said planar regions being different from that of said inclined regions,
      said active layer and said cladding layers being epitaxially grown, with an amphoteric dopant, on said substrate surface such that the sections of said layers deposited on said planar regions are of a first conductivitytype and the sections deposited on said inclined regions are of a second conductivity-type thus forming a plurality of p-n junctions at the intersections of said first and said second conductivity-type sections of said active layer, and electrical means for applying currents of at least a threshold level to said junctions, the currents flowing through a plurality of said junctions to form at least two individual but closely spaced and phase-coupled lasers.

* * * * *